United States Patent
Lee et al.

(10) Patent No.: US 8,710,733 B2
(45) Date of Patent: Apr. 29, 2014

(54) ORGANIC LIGHT-EMITTING DISPLAY WITH BLACK MATRIX

(75) Inventors: Hsin-hung Lee, Hsinchu (TW); Ming-chang Shih, Yuanlin Township, Changhua County (TW)

(73) Assignee: Au Optronics Corp., Hsin-Chu (TW)

( * ) Notice: Subject to any disclaimer, the term of this patent is extended or adjusted under 35 U.S.C. 154(b) by 0 days.

(21) Appl. No.: 12/754,059

(22) Filed: Apr. 5, 2010

(65) Prior Publication Data
US 2010/0187522 A1    Jul. 29, 2010

Related U.S. Application Data

(63) Continuation of application No. 11/463,983, filed on Aug. 11, 2006, now Pat. No. 7,781,348.

(30) Foreign Application Priority Data

Apr. 6, 2006  (TW) .............................. 95112086 A (51) Int. Cl.
*H05B 33/02*   (2006.01)

(52) U.S. Cl.
USPC ........................................................ 313/504

(58) Field of Classification Search
USPC ................................................. 313/512, 504
See application file for complete search history.

(56) References Cited

U.S. PATENT DOCUMENTS

| 4,856,861 | A | 8/1989 | Miyawaki et al. |
| 6,515,428 | B1 | 2/2003 | Yeh et al. |
| 7,098,473 | B2 * | 8/2006 | Lee et al. ........................ 257/40 |
| 2003/0222322 | A1 | 12/2003 | Park et al. |
| 2004/0032558 | A1 * | 2/2004 | Liu et al. ...................... 349/153 |

* cited by examiner

*Primary Examiner* — Anh Mai
*Assistant Examiner* — Hana Featherly (57) ABSTRACT

An organic light-emitting display includes a substrate, a black matrix disposed on the substrate having a first area, a buffer layer covering the black matrix having a second area substantially equaling to the first area of the black matrix, a thin film transistor disposed on the buffer layer, a display electrode electrically connected to the thin film transistor, and a light-emitting diode disposed on the display electrode.

8 Claims, 10 Drawing Sheets

ORGANIC LIGHT-EMITTING DISPLAY WITH BLACK MATRIX

CROSS REFERENCE TO RELATED APPLICATION

This is a continuation application of a U.S. patent application Ser. No. 11/463,983, filed on Aug. 11, 2006 now U.S. Pat. No. 7,781,348.

BACKGROUND OF THE INVENTION

1. Field of the Invention

The present invention relates to a method of forming an organic light-emitting display, and more particularly, to a method of forming an organic light-emitting display having a black matrix.

2. Description of the Related Art

With a rapid development of monitor types, novelty and colorful monitors with high resolution, e.g., liquid crystal displays (LCDs), are indispensable components used in various electronic products such as monitors for notebook computers, personal digital assistants (PDA), digital cameras, and projectors. The demand for the novelty and colorful monitors has increased tremendously.

Liquid crystal display (LCD) monitors control pixel luminance by adjusting voltage drop applied on a liquid crystal layer of the liquid crystal display. Differing from liquid crystal displays (LCDs), Organic Light Emitting Displays (OLEDs) determine the pixel luminance by adjusting forward bias current flowing through an LED. With self-lighting technique without requiring additional light source, OLEDs provide faster response time period than LCDs. In addition, OLEDs have the advantages of better contrast and wider visual angle. More important, OLEDs are capable of being manufactured by existing TFT-LCD process. The commonly used OLEDs utilize a low-temperature polysilicon thin film transistor (LTPS TFT) substrate or amorphous silicon (a-Si) substrate.

Figure 1:
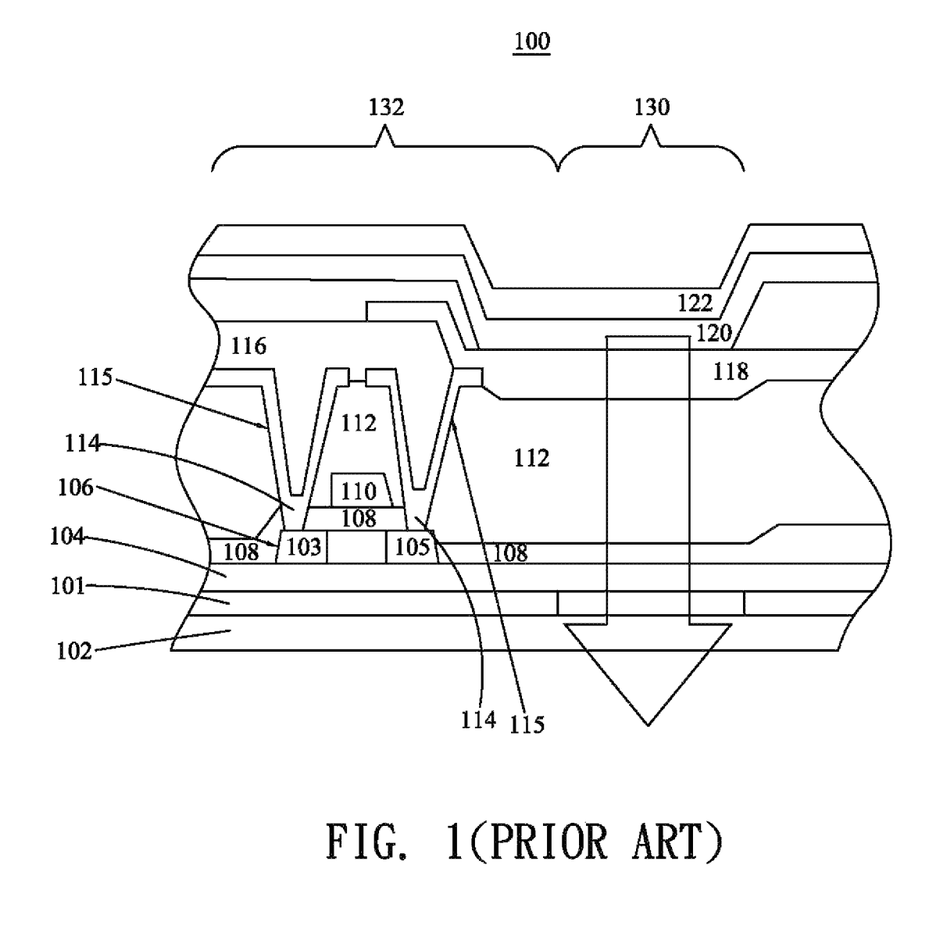
FIG. 1 shows a structure of a thin film transistor applied in an organic light emitting displays according to the prior art.

Please refer to FIG. 1, which shows a structure of a thin film transistor applied in an organic light emitting displays (OLEDs) according to the prior art. In prior art, for forming an Organic Light Emitting Display (OLED) 100, a black matrix 101 with a predetermined size is formed on a glass substrate 102. Next, depositing a buffer layer 104 and an amorphous thin film (not shown) over the black matrix 101 and the glass substrate 102; the amorphous thin film is recrystallized as a poly crystalline thin film by using excimer laser annealing (ELA) process. Furthermore, etching the poly crystalline thin film to form a pattern named as the semiconductor layer 106 is performed by using a first photo-etching-process (PEP). Afterward, a gate insulator 108 is deposited on the semiconductor layer 106 and the buffer layer 104.

Following this procedure, a gate metal 110 is formed using a metal-depositing process and a second PEP. Then, a source 103 and a drain 105 are formed by performing a Boron ion-implanting process for the semiconductor layer 106 using the gate metal 110 as a self-alignment mask. An inter-layer dielectric (ILD) 112 is deposited on the gate metal 110 and the gate insulator 108, and a third PEP is performed to remove a portion of the ILD 112 and the gate insulator 108 on source 103 and drain 105 to generate via holes 115. Next, performing a metal-depositing process and a fourth PEP to generate metal layers 114 (i.e. signal line and drain metal) which covers the via holes 115 and connecting to the source 103 and the drain 105. Then, a planarization layer 116 is deposited on the metal layer 114 and the ILD 112. And a fifth PEP is performed to remove a portion of the planarization layer 116 on the metal layer 114 connecting to the drain 105. After that, an Indium Tin Oxide (ITO) layer, serving as transparent electric conductivity film, is formed on the planarization layer 116. Then, a display electrode 118 is generated by using the sixth PEP. Finally, a light-emitting layer 120 and a cathode metal layer 122 can be sequentially performed to complete fabrication of the OLED 100.

Figure 2:
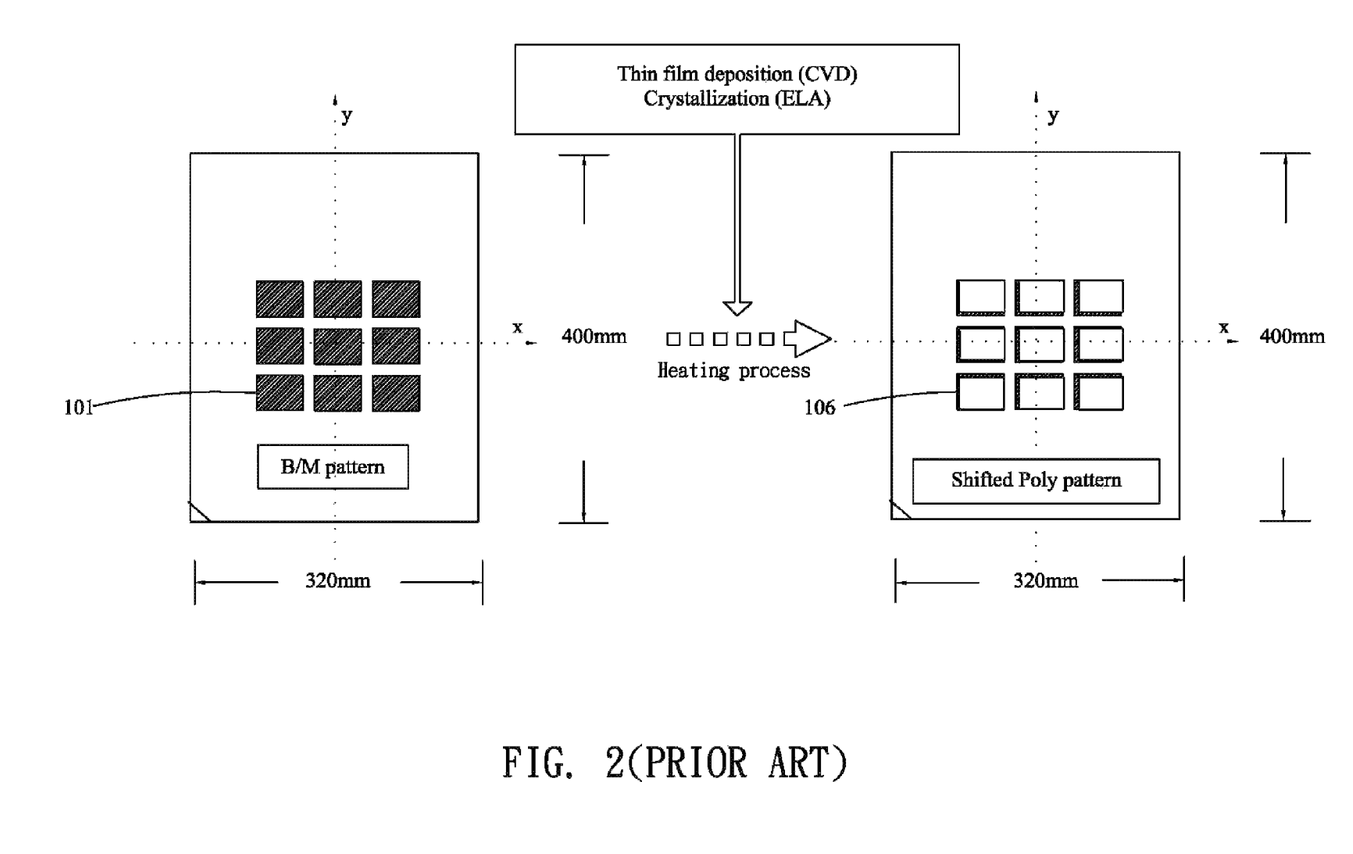
FIG. 2 shows positions of the black matrix 101 relative to other layers of a thin film transistor before and after a heating process according to the prior art.

In general, a pixel has a light-passing region 130 and a non-light-passing region 132 including the black matrix 101. The use of the black matrix 101 is to block light, thereby enhancing chromatic contrast and facilitating photo efficiency of a polarizer. Traditionally, the black matrix 101 fabricated at the bottom of the OLED 100, is a metal film having advantages of easy etching and well light-blocking. As shown in FIG. 2, the positions of the black matrix 101 relative to other layers of a thin film transistor before and after a heating process according to the prior art. In LTPS processes, especially the recrystallization process, high temperature may make the glass substrate shrink, resulting in a misalignment of the black matrix pattern with the other layer of TFT patterns which are formed after the black matrix. The use of a costly non-anneal glass is a resolution, however, cost of the whole OLED may rise as a result of using non-anneal glass.

SUMMARY OF INVENTION

An objective of the present invention is to provide an organic light-emitting display and a method for forming the organic light-emitting display, to solve the problem existing in prior art.

Briefly summarized, the claimed invention is a method for forming an organic light-emitting display (OLED). The method comprises the steps of providing a substrate, forming a black matrix on the substrate, forming a buffer layer on the black matrix, simultaneously patterning the black matrix and the buffer layer, and forming a thin film transistor and a display electrode over the buffer layer.

According to the claimed invention, a method for forming an organic light-emitting display comprises the steps of providing a substrate, forming a black matrix on the substrate, forming a buffer layer on the black matrix, forming a semiconductor layer on the buffer layer, simultaneously patterning the black matrix and the buffer layer, and forming a display electrode over the semiconductor layer.

According to the claimed invention, a method for forming an organic light-emitting display comprises the steps of providing a substrate, forming a black matrix on the substrate, forming a buffer layer on the black matrix, forming a gate metal over the black matrix, depositing a gate oxide layer covering the gate metal and the buffer layer, forming a semiconductor layer on the gate oxide layer, and simultaneously patterning the gate oxide layer, the black matrix and the buffer layer.

According to the claimed invention, an organic light-emitting display comprises a substrate, a black matrix disposed on the substrate, a buffer layer covering the black matrix, a thin film transistor disposed on the buffer layer, a display electrode electrically connected to the thin film transistor, and a light-emitting diode disposed on the display electrode. The black matrix has a first pattern, and the buffer layer has a second pattern substantially equal to the first pattern of the black matrix.

These and other objectives of the present invention will become apparent to those of ordinary skilled in the art after reading the following detailed description of the preferred embodiment that is illustrated in the various figures and drawings.

DETAILED DESCRIPTION OF THE PREFERRED EMBODIMENT

Figure 3:
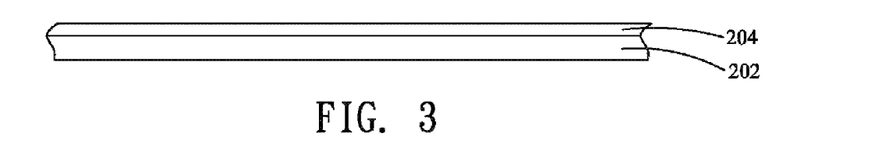
FIGS. 3-12 illustrate a first embodiment of forming an active matrix OLED according to the present invention.
Figure 4:
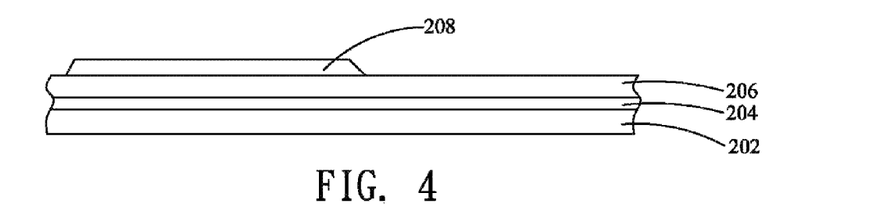
Figure 5:
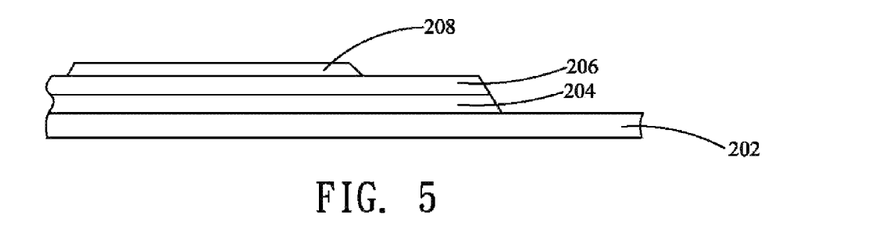

With reference to FIGS. 3-12, a first embodiment illustrating forming an active matrix OLED (AMOLED) 200 according to the present invention. As shown in FIG. 3, a black matrix 204 is formed on a glass substrate 202. Next, a buffer layer 206 is deposited on the black matrix 204, as illustrated in FIG. 4. An amorphous thin film (not shown) is deposited on the buffer layer 206, and the amorphous thin film is recrystallized as a poly crystalline thin film by using excimer laser annealing (ELA) process. Then, etching the poly crystalline thin film to form a pattern named as the semiconductor layer 208 is performed by using a first photo-etching-process (PEP) with a first mask. Afterward, as shown in FIG. 5, etching the black matrix 204 and the buffer layer 206 is performed by using a second PEP with a second mask.

Figure 6:
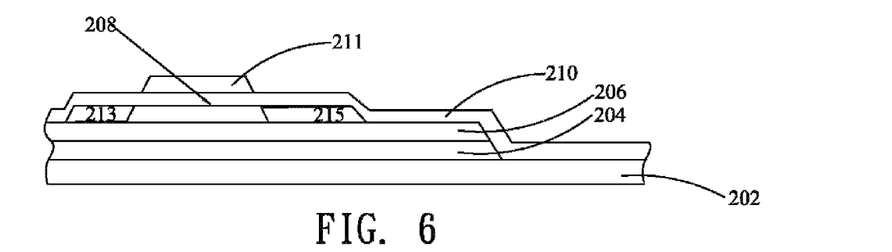

Then, a thin film transistor is formed over the buffer layer 206, as is depicted in detailed below. As shown in FIG. 6, a gate insulator 210 is deposited on the semiconductor layer 208 and the buffer layer 206.

Following this, performing a first metal-depositing process and a third PEP with a third mask forms a gate metal 211 on the gate oxide layer 210, and then, a source 213 and a drain 215, as shown in FIG. 6, are formed by performing a Boron ion-implanting process for the semiconductor layer 208 using the gate metal 211 as a self-alignment mask.

Figure 7:
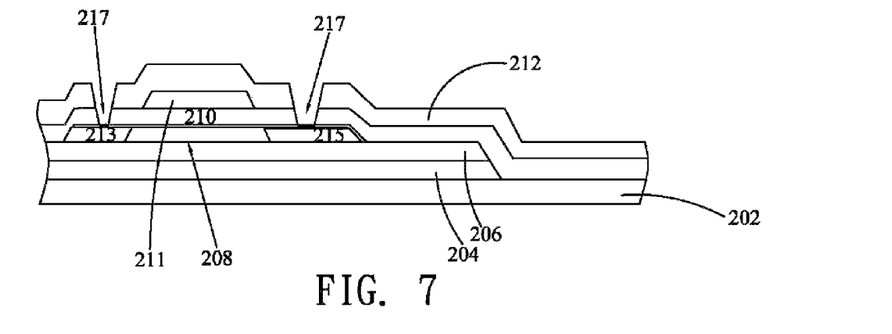

As shown in FIG. 7, an inter-layer dielectric (ILD) 212 is deposited on the gate metal 211 and the gate insulator 210. Then, a fourth PEP with a fourth mask is performed to remove a portion of the ILD 212 and the gate insulator 210 over the source 213 and the drain 215 to form a plurality of via holes 217 on the source 213 and the drain 215.

Figure 8:
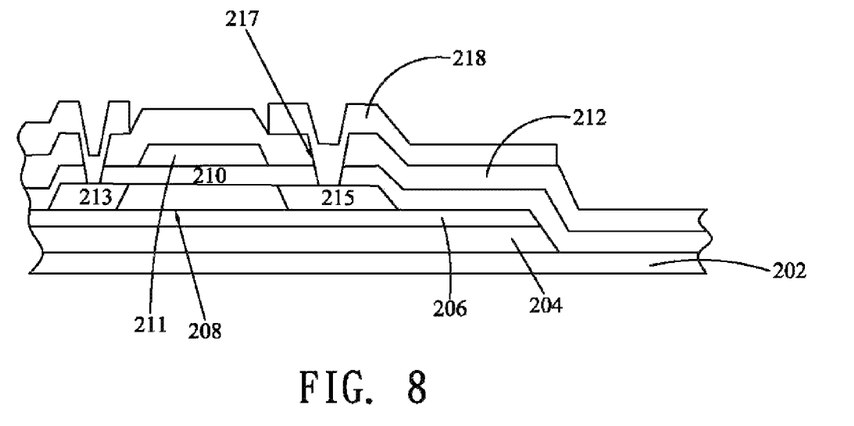
Figure 9:
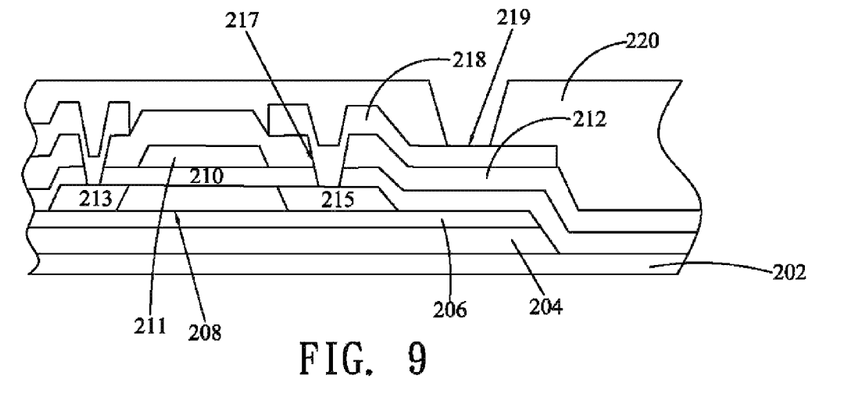

Next, as shown in FIG. 8, performing a second metal-depositing process and a fifth PEP with a fifth mask to generate metal layers 218 (i.e. signal line and drain metal) which covers the via holes 217 and connecting to the source 213 and the drain 215. Then, as shown in FIG. 9, a planarization layer 220 is deposited on the metal layer 218 and the ILD 212. And a sixth PEP with a sixth mask is performed to remove a portion of the planarization layer 220 on the metal layer 218 connected to the drain 215 to generate an electrode hole 219.

Figure 10:
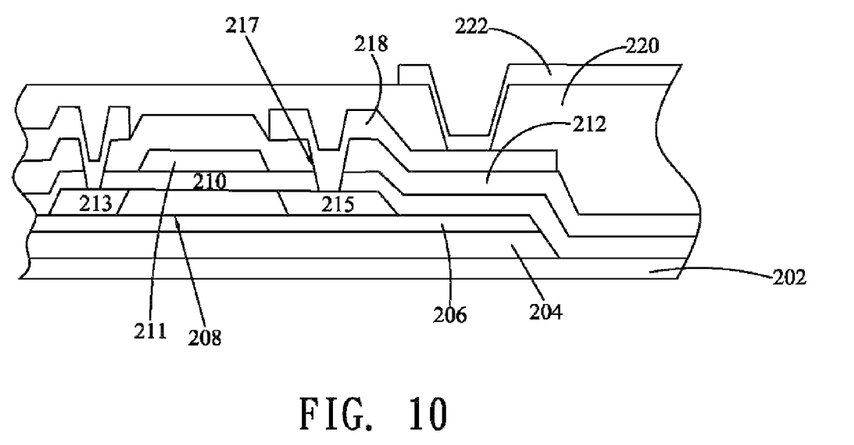
Figure 11:
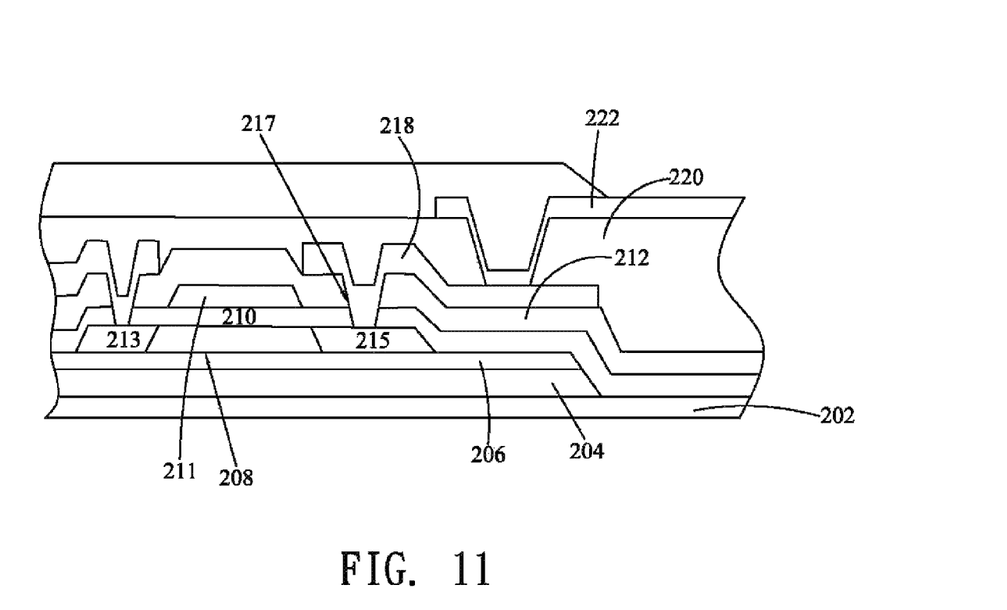
Figure 12:
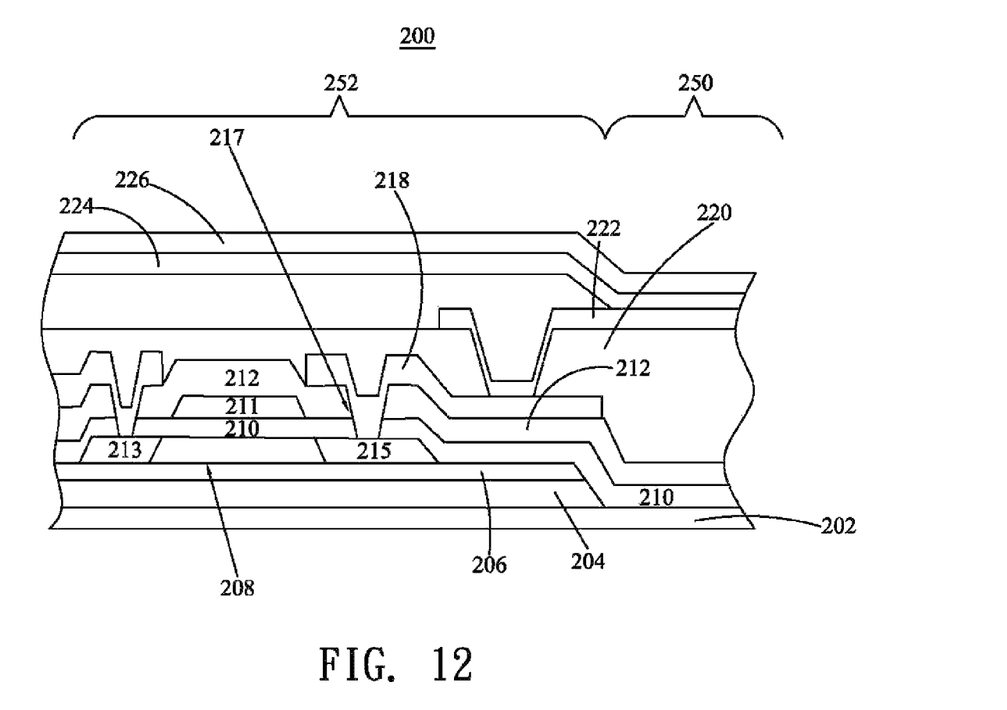

After that, referring to FIG. 10, an Indium Tin Oxide (ITO) layer or an Indium Zinc Oxide (IZO) layer, serving as transparent electric conductivity film, is formed on the planarization layer 220. And a display electrode 222, connecting to metal layer 218 and the drain 215, is formed by performing a sixth PEP with a sixth mask. Accordingly, the display electrode 222 is electrically connected to the thin film transistor formed by the gate metal 211, the source 213 and the drain 215 via the metal layer 218. Finally, with reference to FIGS. 11 and 12, a light-emitting layer 224 and a cathode metal layer 226 in respective order formed on the display electrode 222 can be sequentially performed to complete fabrication of the OLED 200. When the OLED 200 operates, light can pass through a light-passing region 250 but is not liable to pass through a non-light-passing region 252 as result of the black matrix 204 blocking the light.

Figure 13:
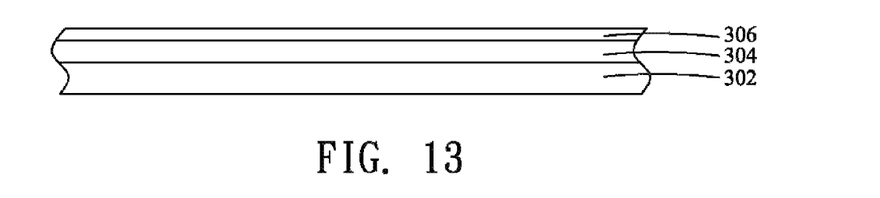
FIGS. 13-22 illustrate a second embodiment of forming an active matrix OLED according to the present invention.
Figure 14:
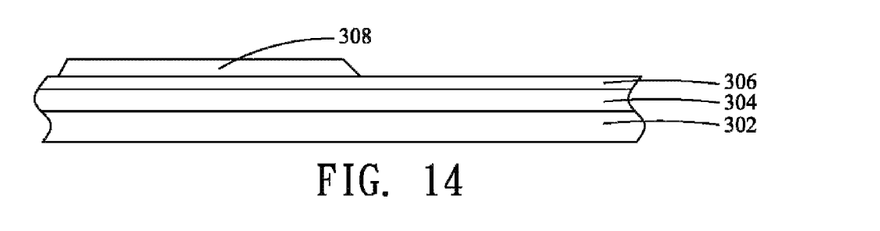

With Reference to FIGS. 13-22, a second embodiment illustrating forming an active matrix OLED (AMOLED) 300 according to the present invention. As shown in FIG. 13, a black matrix 304 is formed on a glass substrate 302. Then, a buffer layer 306 is deposited on the black matrix 304. As shown in FIG. 14, an amorphous thin film (not shown) is deposited on the buffer layer 306, and the amorphous thin film is recrystallized as a poly crystalline thin film by using excimer laser annealing (ELA) process. Then, etching the poly crystalline thin film to form a pattern named as the semiconductor layer 308, is performed by using a first photo-etching-process (PEP) with a first mask.

Figure 15:
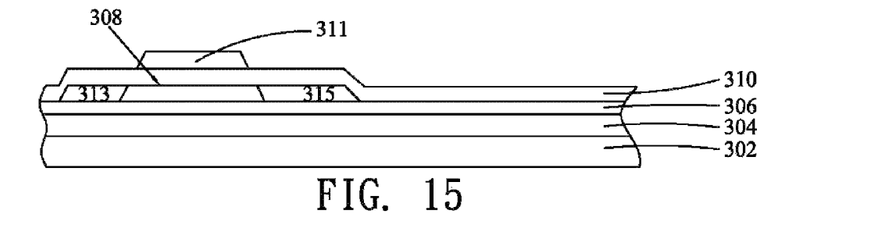

Afterward, as shown in FIG. 15, a thin film transistor is formed over the buffer layer 306, is depicted in details below. A gate insulator 310 is deposited on the semiconductor layer 308 and the buffer layer 306. Following this, performing a first metal-depositing process and a second PEP with a second mask forms a gate metal 311 on the gate oxide layer 310, and then, a source 313 and a drain 315, as shown in FIG. 15, are formed by performing a Boron ion-implanting process for the semiconductor layer 308 using the gate metal 311 as a self-alignment mask.

Figure 16:
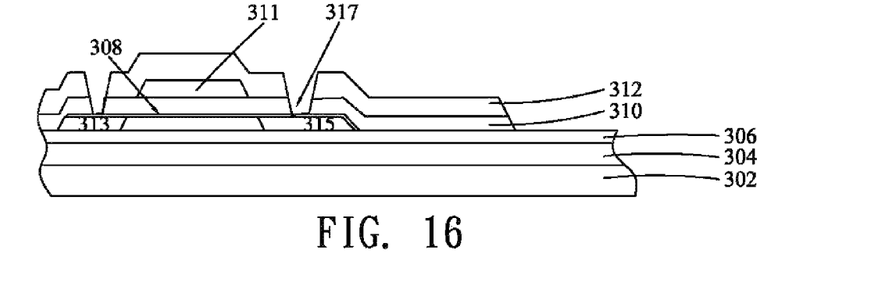

As shown in FIG. 16, an inter-layer dielectric (ILD) 312 is deposited on the gate metal 311 and the gate insulator 310. Then, a third PEP with a third mask is performed to remove a portion of the ILD 312 and the gate insulator 310 over the source 313 and the drain 315 to form a plurality of via holes 317 on the source 313 and the drain 315. Simultaneously, a portion of the ILD 312 and the gate insulator 310 over the buffer layer 306 is also removed during the third PEP.

Figure 17:
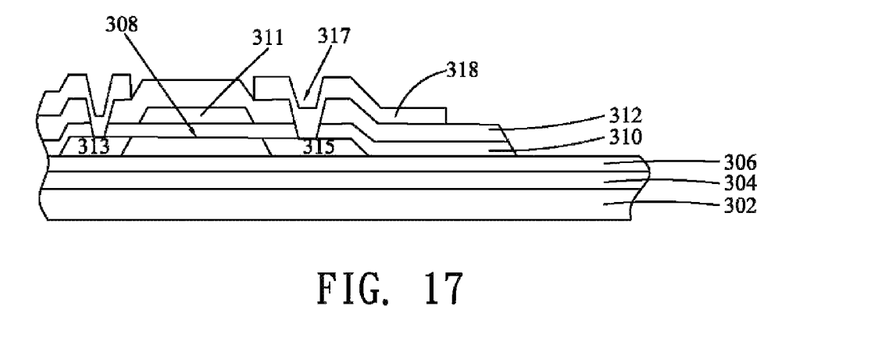
Figure 18:
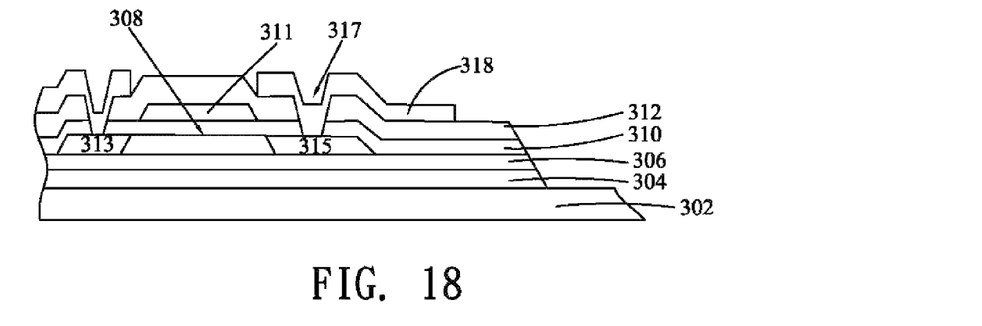

Next, as shown in FIG. 17, performing a second metal-depositing process and a fourth PEP with a fourth mask to generate metal layers 318 (i.e. signal line and drain metal) which covers the via holes 317 and connecting to the source 313 and the drain 315. Then, referring to FIG. 18, etching the black matrix 304 and the buffer layer 306 is performed by using a fifth PEP with a fifth mask, such that a portion of the black matrix 304 and the buffer layer 306, without being covered by the ILD 312 and the gate insulator 310, is removed.

Figure 19:
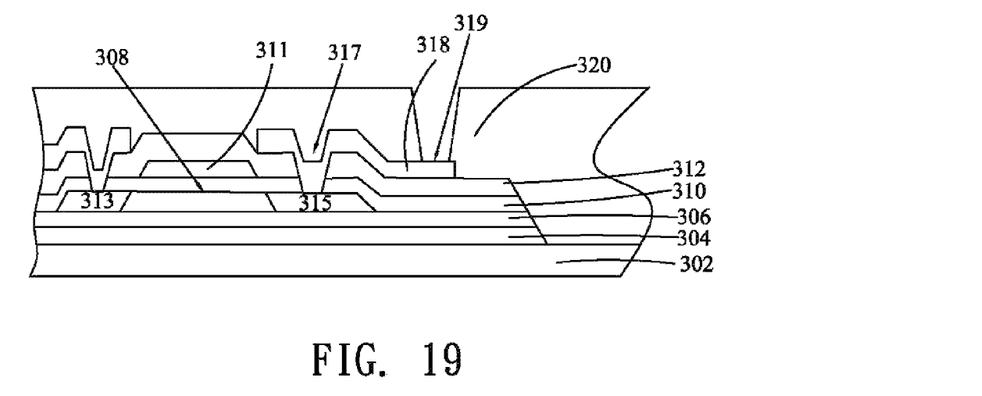
Figure 20:
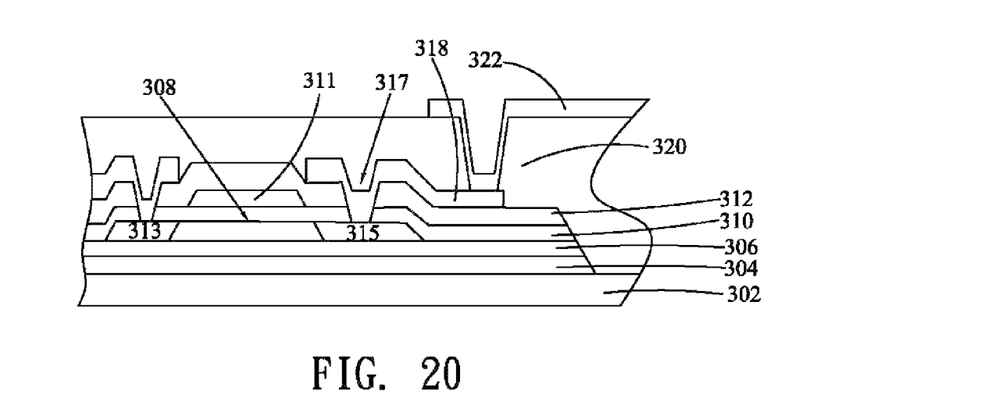
Figure 21:
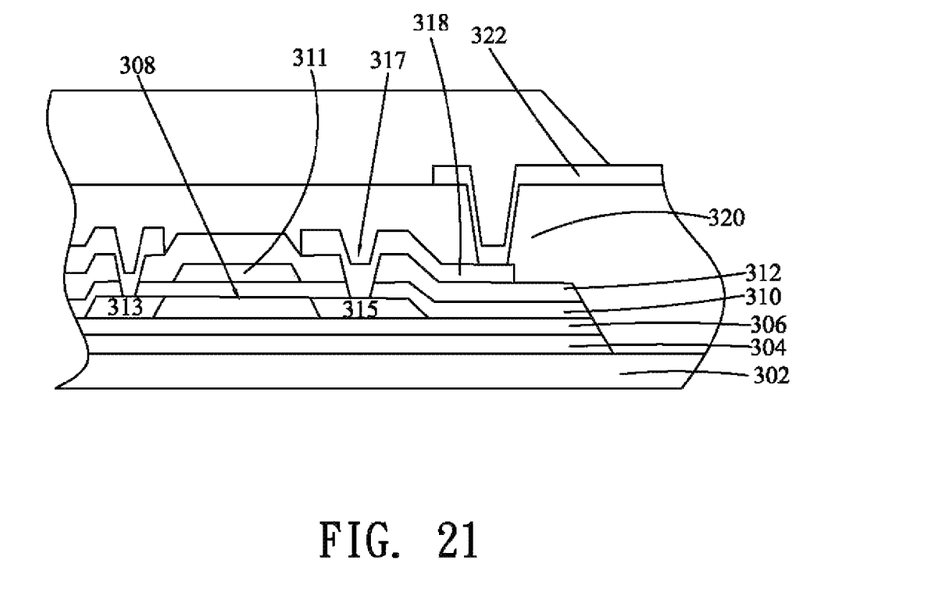
Figure 22:
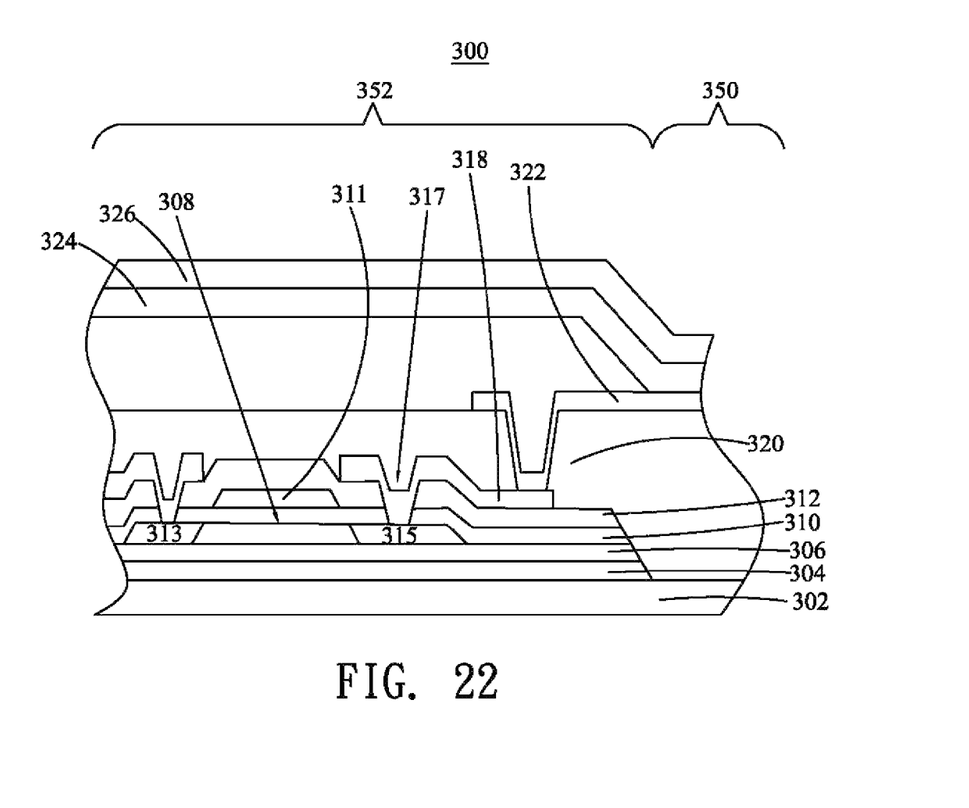

Afterward, as shown in FIG. 19, a planarization layer 320 is deposited on the metal layer 318, the ILD 312 and substrate 302. And a sixth PEP with a sixth mask is performed to remove a portion of the planarization layer 320 on the metal layer 318 connected to the drain 315 to generate an electrode hole 319. After that, referring to FIG. 20, an Indium Tin Oxide (ITO) layer or an Indium Zinc Oxide (IZO) layer, serving as transparent electric conductivity film, is formed on the planarization layer 320. And a display electrode 322, which is connected to metal layer 318 and the source 313, is formed by performing a seventh PEP with a seventh mask. Accordingly, the display electrode 322 is electrically connected to the thin film transistor formed by the gate metal 311, the source 313 and the drain 315 via the metal layer 318. Finally, with reference to FIGS. 21 and 22, a light-emitting layer 324 and a cathode metal layer 326 in respective order formed on the display electrode 322 can be sequentially performed to complete fabrication of the OLED 300. When the OLED 300 operates, light can pass through a light-passing region 350 but is not liable to pass through a non-light-passing region 352 as result of the black matrix 304 blocking the light.

Differing from the first embodiment of the method according to the present invention, the second embodiment of the present invention method has the step of patterning the black matrix performed subsequent to the step of forming the metal layer 317 (as shown in FIG. 17). In this manner, the light-passing region 250 of the OLED 200 of the first embodiment comprises the ILD 212 and the gate oxide layer 210, but the light-passing region 350 of the OLED 300 of the second embodiment does not have the ILD and the gate oxide layer.

In contrast to prior art, both the OLEDs of the first and second embodiments utilize an identical mask in a lithography process. As a result, in addition to CD loss resulting from etching processes, the buffer layers 206, 306 have substantially the same area as the black matrixes 204, 304. In other words, the buffer regions 206 and 306 are disposed above the non-light-passing regions 252 and 352, but no buffer region is disposed above the light-passing regions 250 and 350, so that when light passes the light-passing regions, no chromatic shift effect occurs.

Figure 23:
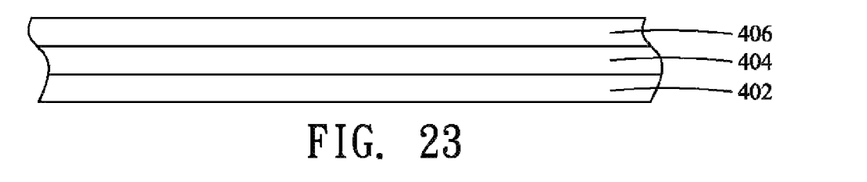
FIGS. 23-28 illustrate a third embodiment of forming an active matrix OLED according to the present invention.
Figure 24:
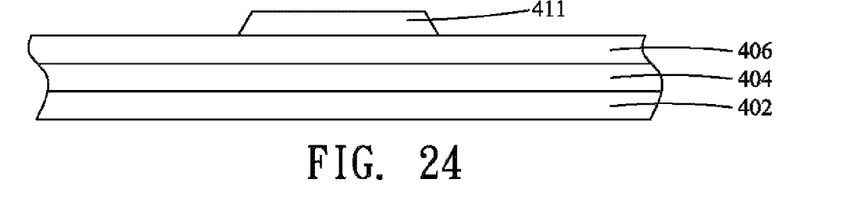
Figure 25:
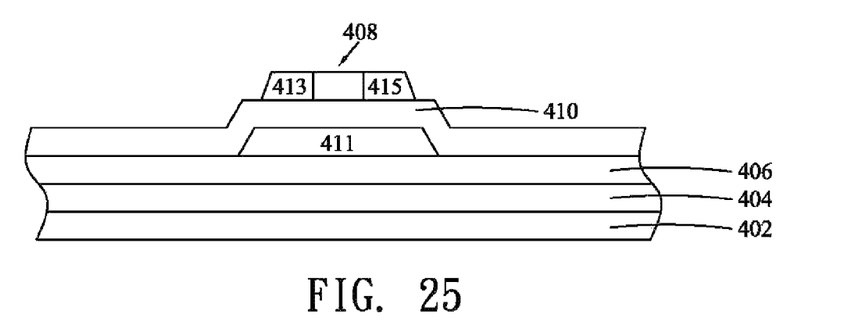

With Reference to FIGS. 23-28, a third embodiment illustrating forming an active matrix OLED (AMOLED) 400 according to the present invention. As shown in FIG. 23, a black matrix 404 is formed on a glass substrate 402. Then, as shown in FIG. 24, a buffer layer 406 is deposited on the black matrix 404.

Referring FIG. 24, a first metal-depositing process forms a first metal film on the buffer layer 406, and a first PEP with a first mask forms a gate metal 411. Following this, referring to FIG. 25, a gate oxide layer 410 is deposited on the gate metal 411 and the buffer layer 406. Then, an amorphous thin film (not shown) is deposited on the buffer layer 406, and the amorphous thin film is recrystallized as a poly crystalline thin film by using excimer laser annealing (ELA) process. Then, etching the poly crystalline thin film to form a pattern named as the semiconductor layer 408 is performed by using a second PEP with a second mask. Afterward, a source 413 and a drain 415 are formed by performing a Boron ion-implanting process for the semiconductor layer 408.

Figure 26:
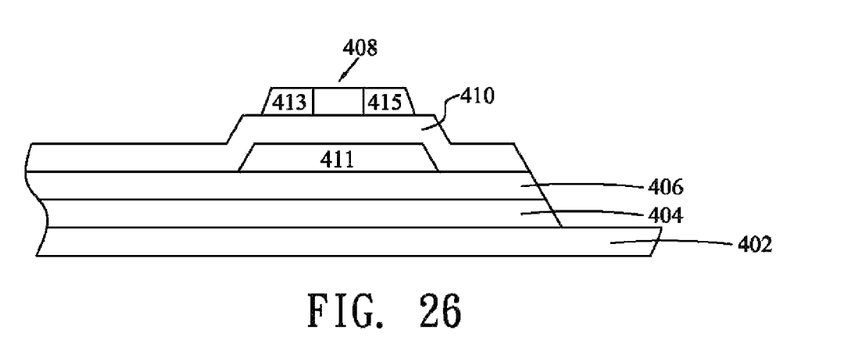

As shown in FIG. 26, a third PEP with a third mask is performed to remove the black matrix 404 and the buffer layer 406. For the black matrix 404 and the buffer layer 406 are patterned with the same mask, the area of the black matrix 404 is identical as that of the buffer layer 406.

Figure 27:
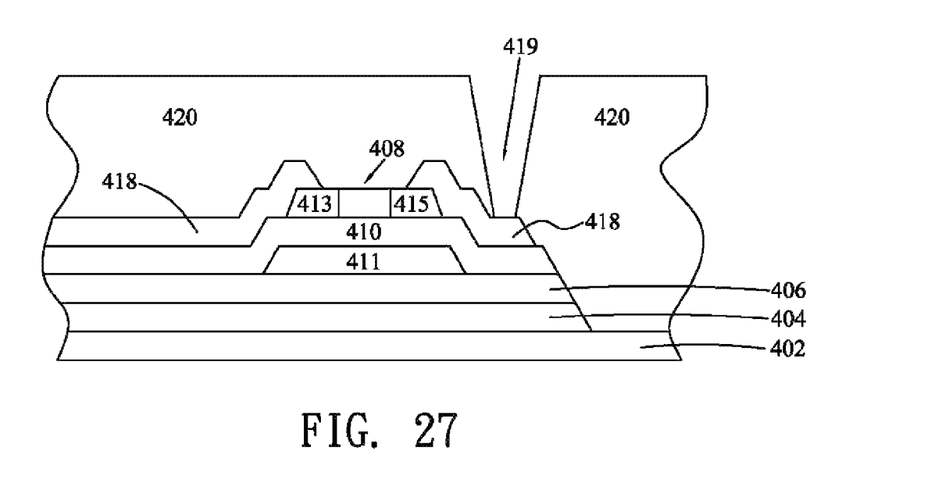

Afterward, a planarization layer 420 is deposited on the metal layer 418. And a fifth PEP with a fifth mask is performed to remove a portion of the planarization layer 420 on the metal layer 418 connected to the drain 415 to generate an electrode hole 419.

Figure 28:
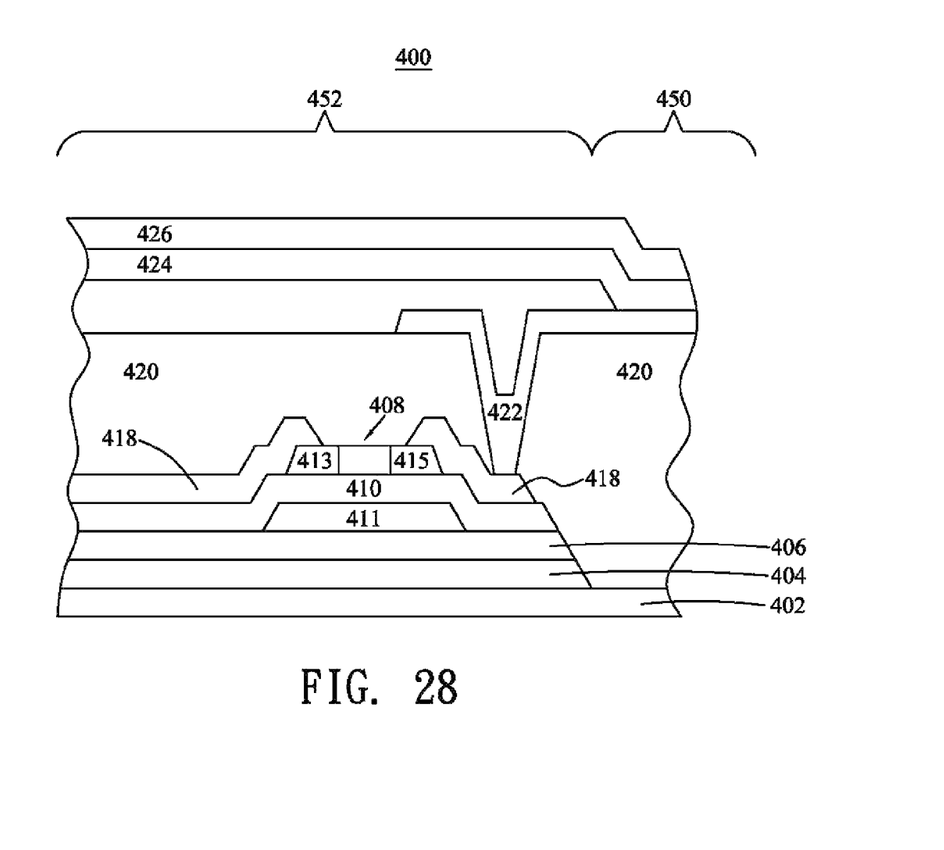

After that, referring to FIG. 28, an Indium Tin Oxide (ITO) layer or an Indium Zinc Oxide (IZO) layer, serving as transparent electric conductivity film, is formed on the planarization layer 420. And a display electrode 422, which is connected to metal layer 418, is formed by performing a sixth PEP with a sixth mask. Accordingly, the display electrode 422 is electrically connected to the thin film transistor formed by the gate metal 411, the source 413 and the drain 415 via the metal layer 418. Finally, a light-emitting layer 424 and a cathode metal layer 426 in respective order formed on the display electrode 422 can be sequentially performed to complete fabrication of the OLED 400. When the OLED 400 operates, light can pass through a light-passing region 450 but is not liable to pass through a non-light-passing region 452 as result of the black matrix 404 blocking the light.

In sum, because the step patterning the black matrix is performed after the step of recrystallizing an amorphous thin film as a poly crystalline thin film, a misalignment of the pattern of the black matrix with the other layer patterns of TFT which are formed after the black matrix, resulting from high temperature making the glass substrate shrink, is avoided. In conclusion, without using a costly non-anneal glass, the OLED using the present invention can reduce cost. Besides, comparing with the prior art, no buffer layer is disposed on the light-passing region, chromatic shift is improved as light passes through it.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. An organic light-emitting display, comprising:
a substrate;
a black matrix disposed on the substrate having a first area;
a buffer layer covering the black matrix, a border of the black matrix exceeds a border of the buffer layer;
a thin film transistor disposed on the buffer layer;
a display electrode electrically connected to the thin film transistor; and
a light-emitting diode disposed on the display electrode.

2. The organic light-emitting diode of claim 1, wherein the thin film transistor comprises a semiconductor layer and a gate metal.

3. The organic light-emitting diode of claim 1, wherein the display electrode is selected from the group consisting of an Indium Tin Oxide (ITO) and an Indium Zinc Oxide (IZO).

4. An organic light-emitting display, comprising:
a substrate;
a black matrix disposed on the substrate having a first area;
a buffer layer covering the black matrix, wherein a border of the black matrix exceeds a border of the buffer layer;
a thin film transistor disposed on the buffer layer;
a display electrode electrically connected to the thin film transistor; and
a light-emitting diode disposed on the display electrode.

5. The organic light-emitting diode of claim 4, wherein the thin film transistor comprises a semiconductor layer and a gate metal.

6. The organic light-emitting diode of claim 4, wherein the display electrode is selected from the group consisting of an Indium Tin Oxide (ITO) and an Indium Zinc Oxide (IZO).

7. An organic light-emitting display, comprising:
a substrate;
a black matrix disposed on the substrate;
a buffer layer covering the black matrix, wherein a border of the black matrix exceeds a border of the buffer layer;
a thin film transistor disposed on the buffer layer;
a display electrode electrically connected to the thin film transistor; and
a light-emitting diode disposed on the display electrode.

8. The organic light-emitting display of claim 7, wherein a projection of the border of the black matrix projected on the substrate exceeds a projection of the border of the buffer layer projected on the substrate.

* * * * *